United States Patent
Maeda (10) Patent No.: US 6,914,464 B2
(45) Date of Patent: Jul. 5, 2005

(54) PHASE LOCKED LOOP CIRCUIT USING FRACTIONAL FREQUENCY DIVIDER

(75) Inventor: Minoru Maeda, Hamamatsu (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 10/620,509

(22) Filed: Jul. 16, 2003

(65) Prior Publication Data

US 2004/0012423 A1 Jan. 22, 2004

(30) Foreign Application Priority Data

Jul. 19, 2002 (JP) ..................................... P. 2002-210396

(51) Int. Cl.[7] ............................................. H03L 7/06
(52) U.S. Cl. ..................................... 327/156; 327/147
(58) Field of Search ................................ 327/147, 156, 327/155, 154, 162, 163; 331/2, 17, 25; 375/373, 374, 375, 376

(56) References Cited

U.S. PATENT DOCUMENTS

| | | | | |
|---|---|---|---|---|
| 4,806,879 A | * | 2/1989 | Troxel | ............................ 331/2 |
| 5,353,311 A | * | 10/1994 | Hirata et al. | ................. 375/135 |
| 6,366,620 B1 | * | 4/2002 | Jackson et al. | ............. 375/308 |
| 6,611,175 B2 | * | 8/2003 | Heymann | ....................... 331/2 |
| 6,700,945 B2 | | 3/2004 | Maeda | ........................ 375/378 |

FOREIGN PATENT DOCUMENTS

JP   06209216   * 7/1994   ........... H03B/28/00

\* cited by examiner

*Primary Examiner*—Linh My Nguyen
(74) *Attorney, Agent, or Firm*—Fish & Richardson P.C.

(57) ABSTRACT

Phase-locked loop (PLL) circuits include first and second PLL stages and use fractional frequency division. In one implementation, the first stage includes a voltage-controlled oscillator (VCO) whose output is provided to both first and second fractional frequency dividers. The output of the first frequency divider is provided to a first phase comparator whose output passes through a filter so as to provide the deviation signal that controls the output frequency of the first VCO. The output of the second fractional frequency divider is received by the second PLL stage as a reference signal.

7 Claims, 5 Drawing Sheets

PHASE LOCKED LOOP CIRCUIT USING FRACTIONAL FREQUENCY DIVIDER

BACKGROUND OF THE INVENTION

1. Field of the Invention

The present invention relates to a phase locked loop (PLL) circuit and, more particularly, to a phase locked loop circuit using a fractional frequency divider, which can set a frequency at a closer step than that of a reference frequency.

2. Description of the Related Art

Figure 5:
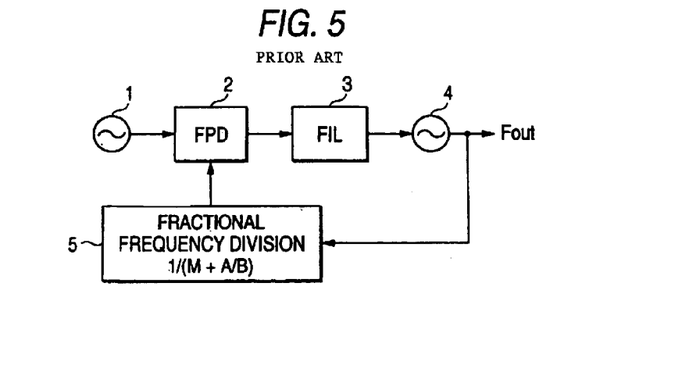
FIG. 5 is a block diagram showing a construction of the phase locked loop circuit of the prior art.

A known phase locked loop circuit of this kind is shown in FIG. 5.

In a phase comparator (FPD) 2, as shown in FIG. 5, a reference frequency 1 is compared in phase with a signal, which is obtained by dividing the frequency of the output of a voltage-controlled oscillator 4 by a fractional frequency divider 5, thereby to generate a deviation signal. This deviation signal controls the output frequency of the voltage-controlled oscillator 4 through a filter (FIL).

With reference of FIG. 7 to FIG. 10, here will be described the operating principle of the phase locked loop using the fractional frequency divider.

Figure 7:
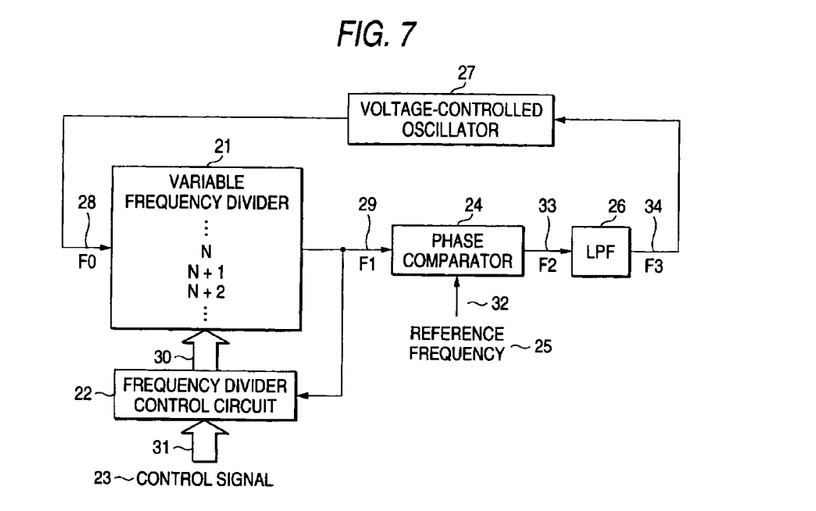
FIG. 7 is a block diagram showing a construction for explaining the operation principle of a phase locked loop circuit using a fractional frequency divider.

In FIG. 7, there is constructed a PLL (Phase Locked Loop) circuit, in which the frequency of an output of a voltage-controlled oscillator 27 is divided by a variable frequency divider 21, in which the output of the frequency divider 21 is compared in phase with a reference signal 25 by a phase comparator 24, and in which the output of the phase comparator 24 is connected through an LPF 26 with a frequency control input 34 of the voltage-controlled oscillator 27.

Figure 8:
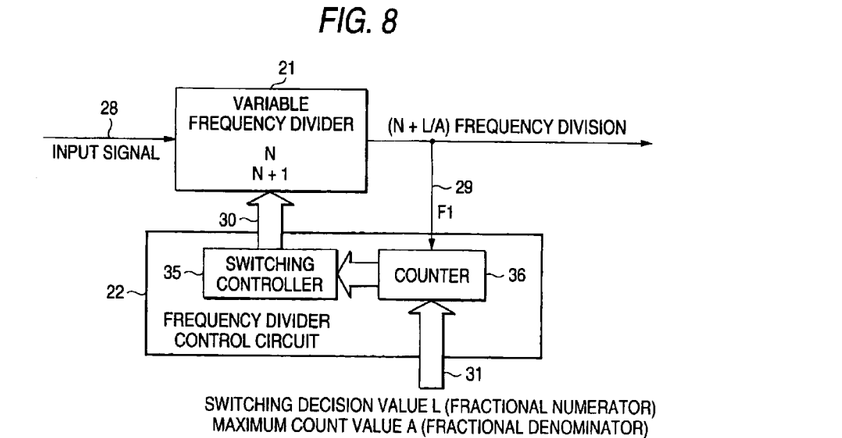
FIG. 8 is a block diagram showing a detailed construction for explaining the operation principle of the phase locked loop circuit using the fractional frequency divider.

FIG. 8 shows the variable frequency divider 21, a counter 36 for counting an output signal F1 of the frequency divider 21, and a switching controller 35 for switching the frequency division ratio of the variable frequency divider 21 according to the counted value. In the case of an average frequency division number of (N+L/A), for example, the frequency of the input signal is divided with a variable frequency number N of the variable frequency divider 21 so that the signal F1 outputted to a signal line 29 is counted to (A−L) by the counter 36. After this, the variable frequency divider 21 is switched to the frequency division number of (N+1) so that its output F1 is counted to A.

When the counting operation is done to A, moreover, the variable frequency divider 21 is switched to the frequency division N.

Figure 9:
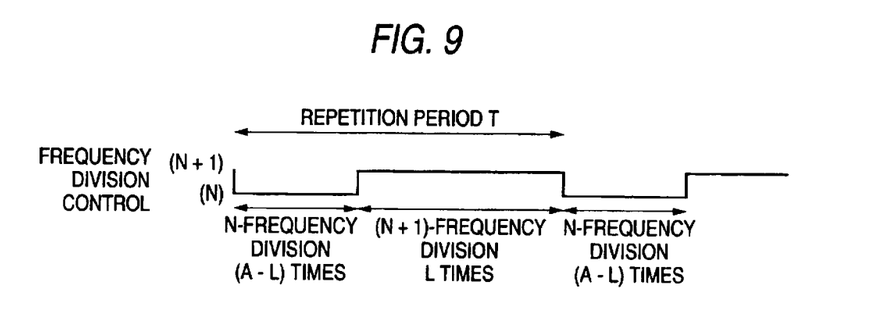
FIG. 9 is a diagram for explaining the operation principle of the fractional frequency divider.
Figure 10:
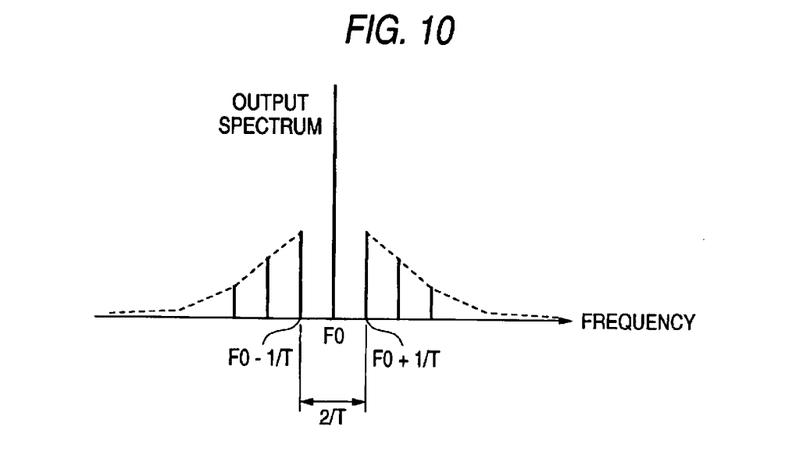
FIG. 10 is a diagram showing the generation of an unnecessary frequency component in the vicinity of an output frequency Fout.

As shown in FIG. 9, more specifically, this frequency division N is continuously used by (A−L) times, and the frequency division (N+1) is continuously used by L times, so that the fundamental frequency using the repetition as the period T and its higher harmonics are generated on the signal line 29. phase comparator 24 and the LPF 26 (PLL filter) modulate the voltage-controlled oscillator 21 thereby to generate an unnecessary frequency component in the vicinity of an output frequency FO (as referred to FIG. 10).

In another method for obtaining the frequency division of (N+L/A), moreover, the frequency division value may be switched such that the result of averaging the frequency division value may be (N+L/A).

In the phase locked loop circuit of FIG. 5, either the fractional frequency division circuit, in which the denominator of the fractional frequency division has a value of squared 2, or a PLL circuit using an IC having the fractional frequency divider packaged therein, generates an output frequency, which is integer times as large as the value obtained by dividing the reference frequency by the value of squared 2.

If the reference frequency is set in the phase locked loop circuit of FIG. 5 to not the value of squared 2 but a rounded value such as 5 MHz or 10 MHz, however, a fraction results for a desired output frequency other than a predetermined one.

In the case of FIG. 5, an output frequency Fout is expressed by:

$$Fout = Fref \cdot (M + A/B).$$

In the case of $B = 2^b$, $$Fout = Fref \cdot (M + A/2^b).$$

Therefore, the minimum set unit of the Fout is $Fref/2^b$. (In the above, letters other than Fout and Fref are integers of 0 or larger.)

Therefore, in the case of Fref=10 MHz and b=18 in FIG. 5, for example, the output frequency Fout has the minimum set unit of 38 Hz, 146 Hz, - - - , and so on so that it has a fraction but for the case of the specific frequency.

Figure 6:
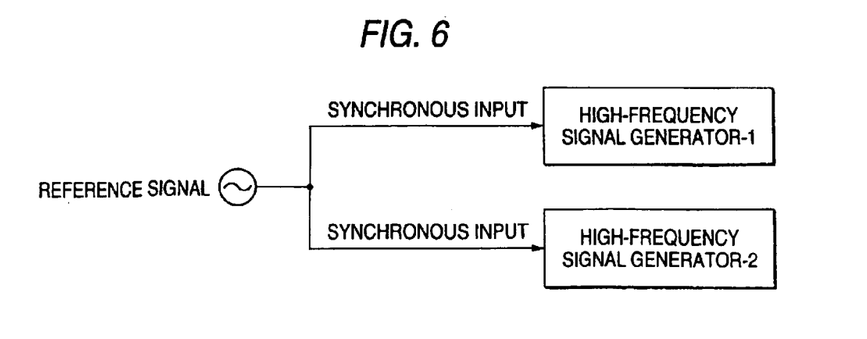
FIG. 6 presents a construction example for synthesizing a high-frequency signal generator using the phase locked loop.

A high-frequency signal generator having an external reference signal input generally has a reference frequency of 10 MHz. In case the high-frequency signal generators are to be synchronized commonly with 10 MHz, as shown in FIG. 6, one high-frequency generator −1 is constructed of a synthesizer of the PLL circuit using the fractional frequency divider of the prior art, as shown in FIG. 5, and the other high-frequency generator −2 is constructed of a synthesizer (of the second PLL stage of FIG. 1) using the ordinary PLL circuit. With these constructions, a frequency deviation is caused to an extent of the fraction irrespective of the common frequency setting, so that no synchronization can be taken.

SUMMARY OF THE INVENTION

An object of the present invention is to provide a phase locked loop circuit, which uses either a fractional frequency divider having a value of squared 2 as the value of the denominator of a fractional frequency division or an IC having the fractional frequency divider packaged therein, and which can produce an output frequency having no fraction even in case the reference frequency has not the value of squared 2 but a rounded frequency (e.g., 10 MHz).

Another object of the invention is to provide a phase locked loop circuit, which can eliminate the unnecessary signal (or spurious) generated with a set value in case a fractional frequency divider or a DDS is used.

In order to solve the above-specified objects, there is provided a phase locked loop circuit, which comprises: a first PLL stage for controlling the output frequency of a first voltage-controlled oscillator with a deviation, which is obtained by dividing the frequency of the output of the first voltage-controlled oscillator by a first fractional frequency divider and by comparing the frequency-divided output with a reference frequency, through a low-pass filter; and a second fractional frequency divider for dividing the frequency of the output of the first PLL stage and for inputting the frequency-divided output as a reference frequency signal of a second PLL stage. The output signal of a second voltage-controlled oscillator of the second PLL stage is extracted.

Moreover, the second PLL stage controls the output frequency of the second voltage-controlled oscillator with a deviation, which is obtained by dividing the frequency of the output of the second voltage-controlled oscillator by the frequency devider and by comparing the frequency-divided output with the reference frequency, through a low-pass filter.

There is also provided a phase locked loop circuit using a fractional frequency divider, which circuit comprises: a first PLL stage for controlling the output frequency of a first voltage-controlled oscillator in accordance with a deviation, which is obtained by comparing the output of the first voltage-controlled oscillator with a reference frequency through a DDS; and a second PLL stage for controlling the output frequency of the second voltage-controlled oscillator in accordance with a deviation, which is obtained by using the output of the first PLL stage as a reference frequency signal and by comparing the output of a second voltage-controlled oscillator divided in frequency by a fractional frequency divider, with the reference frequency signal. The output signal of a second voltage-controlled oscillator of the second PLL stage is extracted.

There is further provided a phase locked loop circuit using a fractional frequency divider, which circuit comprises: a first PLL stage for controlling the output frequency of a first voltage-controlled oscillator with a deviation, which is obtained by dividing the frequency of the output of the first voltage-controlled oscillator by a first fractional frequency divider and by comparing the frequency-divided output with a reference frequency; and a second PLL stage for controlling the output frequency of the second voltage-controlled oscillator in accordance with a deviation, which is obtained by using the output of the first PLL stage as a reference frequency signal and by comparing the output of a second voltage-controlled oscillator through a DDS, with the reference frequency signal. The output signal of a second voltage-controlled oscillator of the second PLL stage is extracted.

Moreover, a band-pass filter is inserted into the front stage of a phase comparator of the first PLL stage in any of the aspect of the invention.

DESCRIPTION OF THE PREFERRED EMBODIMENTS

The phase locked loop circuit of the invention will be described with reference to FIG. 1, FIG. 2 and FIG. 3.

Figure 1:
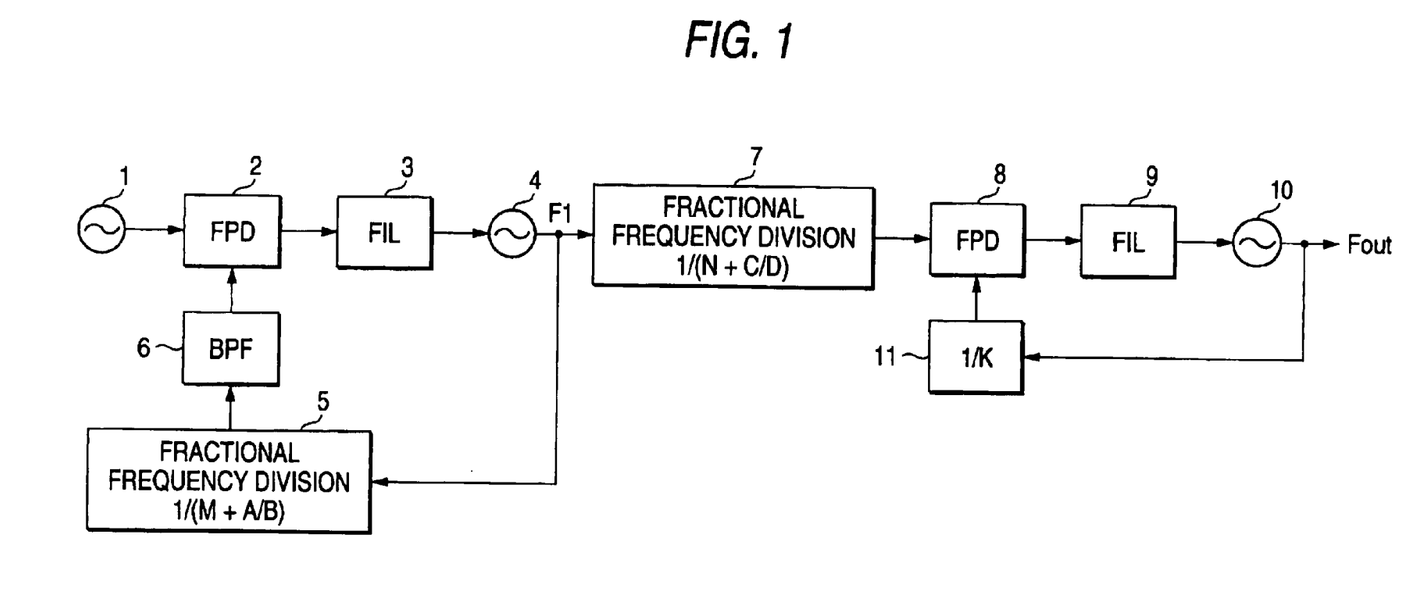
FIG. 1 is a block diagram showing a first construction example of a phase locked loop circuit of the invention.

FIG. 1 is a block diagram showing a first construction example of the phase locked loop circuit of the invention.

In a first PLL stage, as shown in FIG. 1, a reference frequency (Fref) 1 is compared in phase by a first phase comparator (FPD) 2 with the signal, which is obtained by dividing the frequency of an output F1 of a first voltage-controlled oscillator (VCO) 4 by a first fractional frequency divider 5, through a band-pass filter (BPF) 6 (although not essential), thereby to generate a deviation signal. This deviation signal controls the output frequency of the first voltage-controlled oscillator 4 through a first filter (FIL) 3. This first PLL stage has a construction similar to that of FIG. 5 but for the portion of the band-pass filter.

And, the frequency of the output F1 of the first voltage-controlled oscillator 4 is divided by a second fractional frequency divider 7 and is inputted as a reference frequency of a later-described second PLL stage.

In the second PLL stage, the reference frequency, which is obtained by dividing the frequency of the output F1 of the first voltage-controlled oscillator 4 by the second fractional voltage divider 7, is compared in phase in a second phase comparator (FPD) 8 with the signal which is obtained by dividing the frequency of the output of a second voltage-controlled oscillator (VCO) 10 by a frequency divider 11, thereby to generate a deviation signal. This deviation signal controls the output frequency Fout of the second voltage-controlled oscillator 10 through a second filter (FIL) 9.

In the case of FIG. 1, the output frequency Fout is expressed by the following Formulas:

from $$F1=Fref \cdot (M+A/B),$$

and $$Fout/K=F1/(N+C/D),$$

$$Fout = K \cdot Fref \cdot (M + A/B)/(N + C/D)$$
$$= K \cdot Fref \cdot D \cdot (M \cdot B + A)/(B \cdot (N \cdot D + C)).$$

Here in the case $B=2^b$ and $D=2^d$, $$Fout = K \cdot Fref \cdot 2^{(d+b)} \cdot (M \cdot 2^b + A)/(N \cdot 2^d + C).$$

(In the above, letters other than Fref, Fout and F1 are integers of 0 or larger.)

In short, the values of N, d and C can be selected to satisfy $(N \cdot 2^d + C) = 10^e$.

(e: a positive integer)

If N=38 and C=38528 for Fref=10 MHz and b=d=18, for example, $(N \cdot 2^d + C) = 10^7$.

$$Fout = K \cdot 10^7 (M \cdot 2^b + A)/10^7$$
$$= K \cdot (M \cdot 2^b + A).$$

The minimum set unit can be "K" Hz.

In other words, the unit is not a fractional for the set frequency.

Here, the band-pass filter 6 shown in FIG. 1 is effective for eliminating the unnecessary signal component (or spurious) generated in the fractional frequency divider 5, but is not an essential component so that it can be dispensed with.

Figure 2:
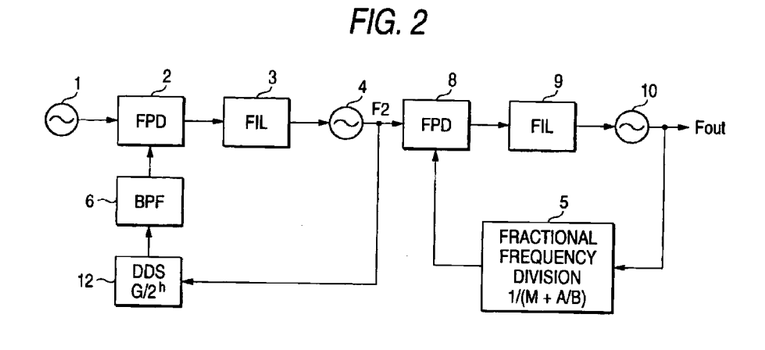
FIG. 2 is a block diagram showing a second construction example of a phase locked loop circuit of the invention.

FIG. 2 is a block diagram showing a second construction example of the phase locked loop circuit of the invention.

In a first PLL stage, as shown in FIG. 2, a reference frequency (Fref) 1 is compared in phase by a first phase comparator (FPD) 2 with the signal, which is obtained by dividing the frequency of an output F2 of a first voltage-controlled oscillator (VCO) 4 by a later-described DDS 12, through a band-pass filter (BPF) 6 (although not essential), thereby to generate a deviation signal. This deviation signal controls the output frequency of the first voltage-controlled oscillator 4 through a first filter (FIL) 3. This first PLL stage has a construction similar to that of FIG. 5 but for the portion, in which the band-pass filter is used and in which the DDS is used in place of the fractional frequency divider 5.

Figure 4:
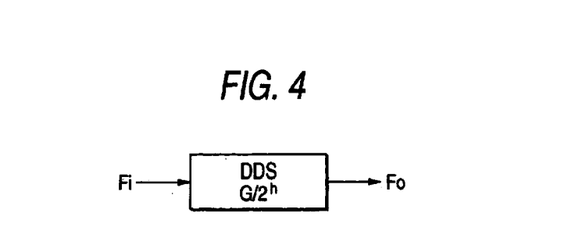
FIG. 4 is a block diagram showing a construction of a DDS (Direct Digital Synthesizer)

Here, the DDS (Direct Digital Synthesizer) can obtain a frequency out put of $Fo=G/2^h \cdot Fi$ from an input clock Fi, as shown in FIG. 4.

At this time, G can take a value from the minimum 1 to the maximum $2^h-1$ (In the above Formula, letters other than Fi and Fo are integers of 0 or larger.)

And, the frequency of the output F2 of the first voltage-controlled oscillator 4 is inputted as a reference frequency of a later-described second PLL stage.

In the second PLL stage, the reference frequency, which is obtained by dividing the reference frequency or the output F2 of the first voltage-controlled oscillator 4 by the second fractional voltage divider 7, is compared in a second phase comparator (FPD) 8 with the signal which is obtained by dividing the frequency of the output of a second voltage-controlled oscillator (VCO) 10 by a first fractional frequency divider 5, thereby to generate a deviation signal. This deviation signal controls the output frequency Fout of the second voltage-controlled oscillator 10 through a second filter (FIL) 9.

In the case of FIG. 2, the output frequency Fout is expressed by the following Formulas:
from $$F1=Fref \cdot (2^h/G)$$

and $$Fout=F2(M+A/B),$$

$$Fout=Fref \cdot 2^h \cdot (M+A/B)/G$$

Here in the case $B=2^b$, $$Fout=K \cdot Fref \cdot 2^{(h-b)} \cdot (M \cdot 2^b+A)/G.$$

(In the above, letters other than Fref, Fout and F2 are integers of 0 or larger.)

In short, the values of h, b and G can be selected to satisfy $2^{(h-b)}/G=10^e$.

(e: a positive integer)

If $G=2^{14} \times 10^5$ for Fref=10 MHz, b=18 and h=32, for example, $2^{(h-b)}/G=10^{-5}$.

$$Fout = 10^7 \cdot 10^{-5}(M \cdot 2^b + A)$$
$$= 100 \cdot (M \cdot 2^b + A).$$

The minimum set unit can be 100 Hz.

In other words, the unit is not a fractional for the set frequency.

Here, the band-pass filter 6 shown in FIG. 2 is effective for eliminating the unnecessary signal component (or spurious) generated in the fractional frequency divider 5, but is not an essential component so that it can be dispensed with.

Figure 3:
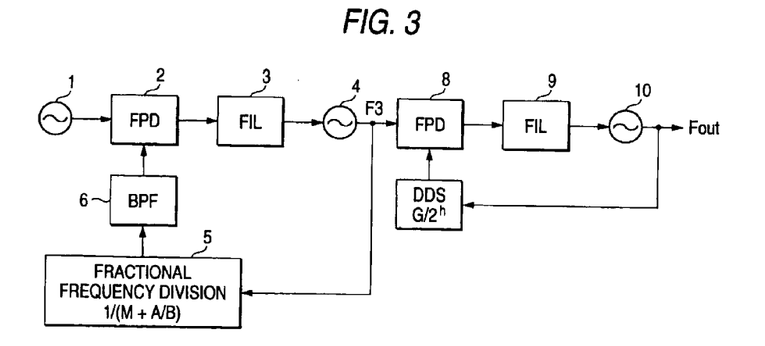
FIG. 3 is a block diagram showing a third construction example of a phase locked loop circuit of the invention.

FIG. 3 is a block diagram showing a third construction example of the phase locked loop circuit of the invention.

In a first PLL stage, as shown in FIG. 3, a reference frequency (Fref) 1 is compared in phase by a first phase comparator (FPD) 2 with the signal, which is obtained by dividing the frequency of an output F1 of a first voltage-controlled oscillator (VCO) 4 by a first fractional frequency divider 5, through a band-pass filter (BPF) 6 (although not essential), thereby to generate a deviation signal. This deviation signal controls the output frequency of the first voltage-controlled oscillator 4 through a first filter (FIL) 3. This first PLL stage has a construction similar to that of FIG. 5 but for the portion of the band-pass filter.

And, the frequency of the output F3 of the first voltage-controlled oscillator 4 is inputted as a reference frequency of a later-described second PLL stage.

In the second PLL stage, substantially as in the first PLL stage of FIG. 2, the frequency of the output F3 of the first voltage-controlled oscillator 4 is compared in a second phase comparator (FPD) 8 with the signal which is obtained by dividing the frequency of the output of a second voltage-controlled oscillator (VCO) 10 by a DDS 12, thereby to generate a deviation signal. This deviation signal controls the output frequency Fout of the second voltage-controlled oscillator 10 through a second filter (FIL) 9.

In the case of FIG. 3, the output frequency Fout is expressed by the following Formulas:
from $$F1=Fref \cdot (M+A/B),$$

and $$Fout=F3/(2^h/G),$$

$$Fout=Fref \cdot (M+A/B)(2^h/G).$$

Here in the case $B=2^b$ and $D=2^d$, $$Fout=Fref \cdot 2^{(h-b)} \cdot (M \cdot 2^b+A)/G.$$

(In the above, letters other than Fref, Fout and F3 are integers of 0 or larger.)

In short, the values of h, b and G can be selected to satisfy $2^{(h-b)}/G=10^e$.

(e: a positive integer)

If $G=2^{14} \times 10^5$ for Fref=10 MHz, b=18 and h=32, for example, $2^{(h-b)}/G=10^5$.

$$Fout = 10^7 \cdot 10^{-5}(M \cdot 2^b + A)$$
$$= K \cdot (M \cdot 2^b + A).$$

The minimum set unit can be 100 Hz.

In other words, the unit is not a fractional for the set frequency.

Here, the band-pass filter 6 shown in FIG. 1 is effective for eliminating the unnecessary signal component (or spurious) generated in the fractional frequency divider 5, but is not an essential component so that it can be dispensed with.

According to a first aspect of the invention, a phase locked loop circuit, which is enabled to obtain an output frequency having no fraction even in the case of a rounded frequency (e.g., 10 MHz), by making a construction comprising: a first PLL stage for controlling the output frequency of a first voltage-controlled oscillator with a deviation, which is obtained by dividing the frequency of the output of the first voltage-controlled oscillator by a first fractional frequency divider and by comparing the frequency-divided output with a reference frequency, through a low-pass filter; and a second fractional frequency divider for dividing the frequency of the output of the first PLL stage and for inputting the frequency-divided output as a reference frequency signal of a second PLL stage. The output signal of a second voltage-controlled oscillator of the second PLL stage is extracted.

According to a second aspect of the invention, moreover, the second PLL stage can be applied to the ordinary one, which controls the output frequency of the second voltage-controlled oscillator with a deviation, which is obtained by dividing the frequency of the output of the second voltage-controlled oscillator by a fractional frequency divider and by comparing the frequency-divided output with the reference frequency, through a low-pass filter.

According to a third aspect of the invention, moreover, a phase locked loop circuit, which is enabled to obtain an output frequency having no fraction even in the case of a rounded frequency (e.g., 10 MHz), by making a construction, although different from that of the first aspect, comprising: a first PLL stage for controlling the output frequency of a first voltage-controlled oscillator in accordance with a deviation, which is obtained by comparing the output of the first voltage-controlled oscillator with a reference frequency through a DDS; and a second PLL stage for controlling the output frequency of the second voltage-controlled oscillator in accordance with a deviation, which is obtained by using the output of the first PLL stage as a reference frequency signal and by comparing the output of a second voltage-controlled oscillator divided in frequency by a fractional frequency divider, with the reference frequency signal. The output signal of a second voltage-controlled oscillator of the second PLL stage is extracted.

According to a fourth aspect of the invention, moreover, a phase locked loop circuit, which is enabled to obtain an output frequency having no fraction even in the case of a rounded frequency (e.g., 10 MHz), by making a construction, although different from that of the first and the second aspects, comprising: a first PLL stage for controlling the output frequency of a first voltage-controlled oscillator with a deviation, which is obtained by dividing the frequency of the output of the first voltage-controlled oscillator by a first fractional frequency divider and by comparing the frequency-divided output with a reference frequency; and a second PLL stage for controlling the output frequency of the second voltage-controlled oscillator in accordance with a deviation, which is obtained by using the output of the first PLL stage as a reference frequency signal and by comparing the output of a second voltage-controlled oscillator through a DDS, with the reference frequency signal. The output signal of a second voltage-controlled oscillator of the second PLL stage is extracted.

According to a fifth aspect of the invention, moreover, it is effective to eliminate the unnecessary signal component (or spurious), as might otherwise be produced in the fractional frequency divider, by inserting a band-pass filter into the front stage of a phase comparator of the first PLL stage.

What is claimed is:

1. A phase locked loop (PLL) circuit using a fractional frequency divider, comprising:
    a first PLL stage for controlling an output frequency of a first voltage-controlled oscillator with a deviation, which is obtained by dividing the frequency of the output of said first voltage-controlled oscillator by a first fractional frequency divider and by comparing the frequency-divided output with a first reference frequency in a first phase comparator whose output passes through a filter; and
    a second fractional frequency divider for dividing the frequency of the output from the first voltage-controlled oscillator of said first PLL stage;
    a second PLL stage for receiving an output of said second fractional frequency divider as a second reference frequency signal.

2. A phase locked loop circuit using a fractional frequency divider, according to claim 1,
    wherein said second PLL stage is constructed to control the output frequency of said second voltage-controlled oscillator by a frequency divider and by comparing the frequency-divided output from said frequency divider with the second reference frequency in a second phase comparator whose output passes through a filter.

3. A phase locked loop (PLL) circuit using a fractional frequency divider, comprising:
    a first PLL stage for controlling an output frequency of a first voltage-controlled oscillator in accordance with a deviation, which is obtained by comparing in a first phase comparator an output of said first voltage-controlled oscillator with a first reference frequency, wherein the output of the first voltage-controlled oscillator passes through a direct digital synthesizer (DDS) for multiplication by $G/2^h$; and
    a second PLL stage for controlling an output frequency of a second voltage-controlled oscillator in accordance with a deviation, which is obtained by comparing in a second phase comparator the output of said second voltage-controlled oscillator with a signal that is frequency-divided from the output of the second voltage-controlled oscillator by a fractional frequency divider, with the output of said first PLL stage used as a second reference frequency signal,
    wherein frequency division by the fractional frequency divider is expressed by $1/(m+A/2^b)$, wherein the value of $2^{(h-b)}/G$ is equal to a factorial of a positive integer of 10.

4. A phase locked loop (PLL) circuit using a fractional frequency divider, comprising:
    a first PLL stage for controlling an output frequency of a first voltage-controlled oscillator with a deviation, which is obtained by frequency-dividing the output of said first voltage-controlled oscillator by a first fractional frequency and by comparing in a first phase comparator the frequency-divided output with a first reference frequency; and
    a second PLL stage for controlling an output frequency of a second voltage-controlled oscillator in accordance with a deviation, which is obtained by comparing an output of said second voltage-controlled oscillator passed through a direct digital synthesizer (DDS) for multiplying the output of said second stage voltage-controlled oscillator by $G/2^h$, with the output of said first PLL stage as a second reference frequency;
    wherein frequency division by the fractional frequency divider is expressed by $1/(m+A/2^b)$, wherein the value of $2^{(h-b)}/G$ is equal to a factorial of a positive integer of 10.

5. A phase locked loop circuit using a fractional frequency divider, according to any of claims 1, 3 and 4, further comprising:
    a band-pass filter inserted into a front stage of the first phase comparator of said first PLL stage.

6. A phase-locked loop (PLL) circuit using a frequency divider, according to claim 1 wherein said second fractional frequency divider has a frequency division ratio of 1/(N+C/D) to output said reference frequency signal having a frequency of (N*D+C) Hz.

7. A phase-locked loop (PLL) circuit using a frequency divider according to claim 6 wherein the value of D is a factorial of 2.

* * * * *